United States Patent
Yoon

(10) Patent No.: US 7,759,214 B2
(45) Date of Patent: Jul. 20, 2010

(54) SEMICONDUCTOR INCLUDING STI AND METHOD FOR MANUFACTURING THE SAME

(75) Inventor: Suh Byoung Yoon, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 629 days.

(21) Appl. No.: 11/505,727

(22) Filed: Aug. 17, 2006

(65) Prior Publication Data

US 2007/0042564 A1 Feb. 22, 2007

(30) Foreign Application Priority Data

Aug. 18, 2005 (KR) .................... 10-2005-0075756

(51) Int. Cl.
*H01L 21/02* (2006.01)
(52) U.S. Cl. ................... 438/424; 438/711; 438/729
(58) Field of Classification Search .............. None
See application file for complete search history.

(56) References Cited

U.S. PATENT DOCUMENTS

| | | | | |
|---|---|---|---|---|
| 5,106,777 A * | 4/1992 | Rodder | .................... | 438/426 |
| 5,776,808 A * | 7/1998 | Muller et al. | ............... | 438/243 |
| 6,265,317 B1 * | 7/2001 | Chiu et al. | ................. | 438/711 |
| 6,541,382 B1 * | 4/2003 | Cheng et al. | ............... | 438/692 |
| 6,602,434 B1 * | 8/2003 | Hung et al. | ................... | 216/39 |
| 6,635,945 B1 * | 10/2003 | Ishitsuka et al. | .......... | 257/510 |
| 6,818,526 B2 * | 11/2004 | Mehrad et al. | ............. | 438/424 |
| 6,828,248 B1 * | 12/2004 | Tao et al. | ..................... | 438/711 |
| 6,858,515 B2 * | 2/2005 | Ishitsuka et al. | ........... | 438/424 |
| 7,105,899 B2 * | 9/2006 | Agarwal et al. | ............. | 257/374 |
| 7,118,987 B2 * | 10/2006 | Fu et al. | ..................... | 438/435 |
| 7,125,783 B2 * | 10/2006 | Lo et al. | ..................... | 438/424 |
| 7,157,324 B2 * | 1/2007 | Agarwal et al. | ............. | 438/221 |
| 7,265,026 B2 * | 9/2007 | Choi | .......................... | 438/437 |
| 2003/0186555 A1 * | 10/2003 | Liang et al. | ................. | 438/724 |
| 2004/0077152 A1 * | 4/2004 | Ishitsuka et al. | ........... | 438/400 |
| 2005/0079682 A1 * | 4/2005 | Lee et al. | .................... | 438/400 |
| 2005/0142800 A1 * | 6/2005 | Choi | .......................... | 438/424 |
| 2005/0170606 A1 * | 8/2005 | Fu et al. | ..................... | 438/424 |
| 2006/0148197 A1 * | 7/2006 | Wu et al. | .................... | 438/424 |
| 2006/0214212 A1 * | 9/2006 | Horita et al. | ................ | 257/300 |
| 2007/0042564 A1 * | 2/2007 | Yoon | .......................... | 438/424 |

* cited by examiner

*Primary Examiner*—David E Graybill
(74) *Attorney, Agent, or Firm*—Saliwanchik, Lloyd & Saliwanchik

(57) ABSTRACT

Provided is a semiconductor device and method of making, incorporating a trench having rounded edges. According to an embodiment, a pad oxide layer, nitride layer, and TEOS layer are sequentially formed on a substrate. The TEOS layer, nitride layer, and pad oxide layer are dry-etched using a photosensitive layer pattern as a mask. After removing the photosensitive layer pattern, a trench is formed by dry-etching the substrate using the etched TEOS layer, nitride layer, and pad oxide layer as a mask. A portion of the pad oxide layer is pullback-etched, resulting in a first rounding of the trench. A portion of the etched nitride layer is pullback-etched and a portion of the etched TEOS layer is pullback-etched. The upper corner of the trench of the substrate is dry-etched using the pullback-etched TEOS layer, nitride layer, and pad oxide layer as a mask, resulting in a second rounding of the trench.

8 Claims, 5 Drawing Sheets

SEMICONDUCTOR INCLUDING STI AND METHOD FOR MANUFACTURING THE SAME

RELATED APPLICATION

This application claims the benefit, under 35 U.S.C. §119(e), of Korean Patent Application Number 10-2005-0075756 filed Aug. 18, 2005, which is incorporated herein by reference in its entirety.

FIELD OF THE INVENTION

The present invention relates to a semiconductor device including shallow trench isolation (STI) and a method for manufacturing the same.

BACKGROUND OF THE INVENTION

Generally, to form semiconductor devices such as transistors and capacitors on a semiconductor substrate, a device isolation layer is formed on a semiconductor substrate. The device isolation layer divides the semiconductor substrate into an active region that allows electrical conduction and a device isolation region that prevents electrical conduction and separates semiconductor devices from each other.

As recent semiconductor technology requires a fine device isolation technology in order to achieve high integration and low power consumption of devices, STI is widely used.

An STI process includes forming a trench having a predetermined height in a semiconductor substrate, depositing an oxide layer in the trench, and etching an unnecessary portion of the oxide layer to form a device isolation layer on the semiconductor substrate.

However, since an upper corner of an STI formed by the prior art is sharp, stress is concentrated on the upper corner during a subsequent thermal process, and thus a silicon defect is generated around the upper corner and an electric field concentration phenomenon during an operation of a device occurs.

Also, according to the prior art, when a field effect is concentrated on a corner of the trench of the device isolation layer, the leakage current of a semiconductor device increases.

SUMMARY OF THE INVENTION

Accordingly, the present invention is directed to a semiconductor device including an STI and a method for manufacturing the same that addresses and/or substantially obviates one or more problems, limitations, and/or disadvantages of the prior art.

An object of the present invention is to provide a semiconductor device including an STI and a method for manufacturing the same, capable of preventing a leakage current generation and stress concentration caused by corners of a trench through applying a rounding process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing a semiconductor device including an STI, the method including: sequentially forming a pad oxide layer, a nitride layer, and a tetra ethyl ortho silicate (TEOS) layer on a substrate; forming photosensitive layer patterns for limiting a device isolation region on the TEOS layer; sequentially dry-etching the TEOS layer, the nitride layer, and the pad oxide layer using the photosensitive layer patterns as a mask; removing the photosensitive layer patterns and dry-etching the substrate using the etched TEOS layer, nitride layer, and pad oxide layer as a mask to form a trench; pullback-etching a portion of the pad oxide layer by performing a post cleaning inside of the trench; pullback-etching a portion of the etched nitride layer by wet etching; pullback-etching a portion of the etched TEOS layer by wet etching; and dry-etching a portion of an upper corner of the trench of the substrate using the pullback-etched TEOS layer, nitride layer, and pad oxide layer as a mask.

In another aspect of the present invention, there is provided a method for manufacturing a semiconductor device including an STI, the method including: sequentially forming a pad oxide layer and a nitride layer on a substrate; forming photosensitive layer patterns for limiting a device isolation region on the nitride layer; sequentially dry-etching the nitride layer and the pad oxide layer using the photosensitive layer patterns as a mask; removing the photosensitive layer patterns and dry-etching the substrate using the etched nitride layer and pad oxide layer as a mask to form a trench; pullback-etching a portion of the pad oxide layer by performing a post cleaning inside of the trench; pullback-etching a portion of the etched nitride layer by wet etching; and dry-etching a portion of an upper corner of the trench of the substrate using the pullback-etched nitride layer and pad oxide layer as a mask.

In a further aspect of the present invention, there is provided a semiconductor device including a substrate in which a trench for STI is formed, wherein the trench has a first rounding formed in an upper corner of the trench and a second rounding formed on the first rounding, the second rounding having a gentler slope than that of the first rounding.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

A method for manufacturing a semiconductor device including an STI according to one embodiment of the present invention includes sequentially forming a pad oxide layer, a nitride layer, and a tetra ethyl ortho silicate (TEOS) layer on a substrate, and forming a trench in the substrate.

Figure 1:
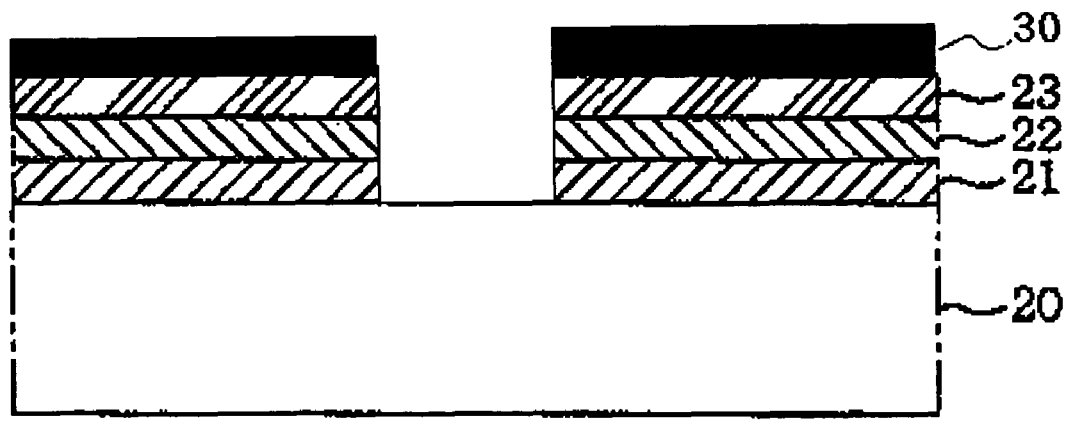
FIGS. 1 to 8 are cross-sectional views showing a process for manufacturing a semiconductor device including an STI according to an embodiment of the present invention.

Referring to FIG. 1, before forming a trench in which an STI is to be filled, a pad oxide layer 21, a nitride layer 22, and a TEOS layer 23 can be sequentially formed on a substrate 20.

In an embodiment, the substrate 20 can be a silicon wafer. The pad oxide layer 21 can be a thermal oxidation layer formed at a thickness of about 50-70 Å. In a specific embodiment, the pad oxide layer can be formed by heating the substrate 20 in air. The nitride layer 22 can be formed at a thickness of about 900-1200 Å. In a specific embodiment, the nitride layer can be formed using chemical vapor deposition (CVD). The TEOS layer 23 can be deposited at a thickness of about 900-1200 Å.

The TEOS layer 23 can allow subsequent photosensitive layer patterns 30 to be stably formed and can prevent a peeling phenomenon where the photosensitive layer patterns 30 get loose and peel away.

Next, photosensitive layer patterns 30 can be formed on the TEOS layer 23 to form the device isolation regions. The TEOS layer 23, the nitride layer 22, and the pad oxide layer 21 can be sequentially dry-etched using the photosensitive layer patterns 30 as a mask. In an embodiment, the dry etching can be reactive ion etching (RIE).

Figure 2:
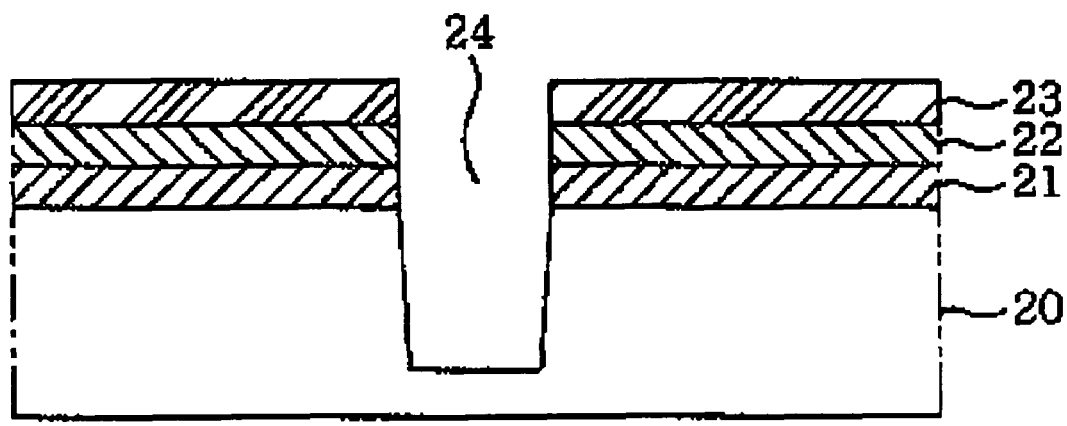

Next, referring to FIG. 2, an exposed portion of the substrate 20 can be etched to a predetermined depth using the etched TEOS 23, nitride layer 22, and pad oxide layer 21 as a mask, so that a trench 24 is formed. In an embodiment, the etching of the substrate 20 can be RIE.

Figure 3:
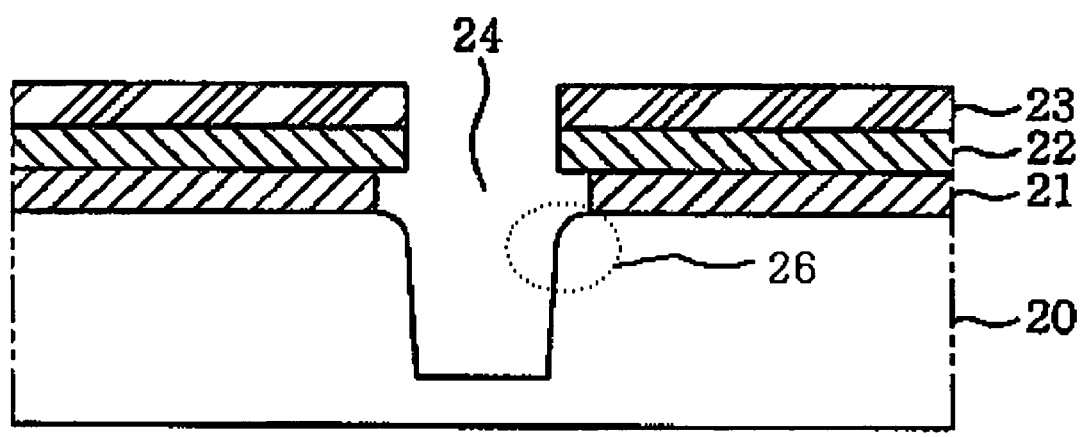

In a further embodiment, referring to FIG. 3, post cleaning can be performed to recover from damage that may be generated on the inner walls of the trench 24 by the dry etching. The post cleaning can be performed by immersing the substrate in a mixed solution of a Standard Clean 1 (SC1) solution (mixture of 30% NHOH, 30% $H_2O_2$, and pure water) and HF diluted at 200:1.

In a specific embodiment, a lateral side of the pad oxide layer 21 can be etched 80-120 Å by the post cleaning.

In addition to etching the lateral side of the pad oxide layer 21, the inside of the trench 24 can be cleaned by the post cleaning such that the corner of the trench comes to have a first-rounded shape (26).

When an upper structure of the trench 24 first-rounded as described above is filled with an insulation material, the angle of the trench 24 widens so that gap filling can be effectively increased.

Therefore, voids can be prevented from being created during the process of filling the trench 24 even without a separate process of forming a spacer. In addition, filling performance can be remarkably improved.

In a further embodiment, to perform a second rounding process, dry-etching a corner of the trench 24 can be performed a second time. However, since the dry-etching has an anisotropic characteristic, the nitride layer 22 and the TEOS layer 23 become obstacles when the dry-etching the corner of the trench 24 is performed.

Therefore, according to an embodiment of the present invention, a process of selectively pull-back etching the nitride layer 22 and the TEOS layer 23 can be added in order to expose a portion of the trench 24 on which dry-etching is to be performed.

Figure 4:
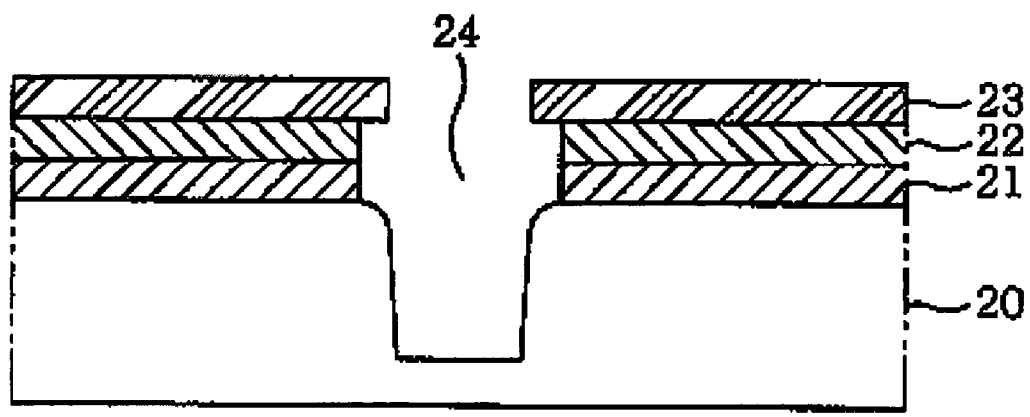

FIG. 4 illustrates a process of selectively pull-back etching a portion of the nitride layer 22. In one embodiment, the pull-back etching of the portion of the nitride layer 22 can be wet-etching using a $H_3PO_4$ solution.

In a specific embodiment, a process of pull-back etching the portion of the nitride layer 22 can include immersing the substrate 20 in a phosphoric acid at high temperature of about 150-170° C. for a short time, e.g., 1-2 minutes to remove a predetermined thickness of sidewalls and a upper surface of the nitride layer 22. Therefore, a sidewall profile of the nitride layer 22 and the trench 24 can be improved to be smooth.

In another embodiment, the process of pull-back etching the portion of the nitride layer 22 can be performed by immersing the substrate 20 in chemicals including $O_3$.

In a specific embodiment, the process of pull-back etching the portion of the nitride layer 22 can be performed by immersing the substrate 20 in low concentration chemical, e.g., a HF solution diluted at a ratio of 1000:1 and in which $O_3$ of 20-25 ppm is resolved for 10-20 minutes. Referring to FIG. 4, a nitride layer 22 damaged by the dry-etching for forming the trench 24 can be etched to a predetermined thickness using a low concentration HF solution containing $O_3$.

In embodiments, a lateral side of the nitride layer 22 can be etched 80-120 Å using a pull-back etching process.

When a predetermined portion of the nitride layer 22 is processed and etched using an HF solution containing $O_3$, a sidewall of the nitride layer 22 and the trench 24 can have a gentle slope. Also, when the nitride layer 22 is processed using the HF solution containing $O_3$, damages and a natural oxide layer on an inner wall of the trench 24 can be simultaneously recovered. Moreover, since HF within the HF solution containing $O_3$ is diluted at 1000:1 as described above, a corner of the pad oxide layer 21 is not encroached.

Figure 5:
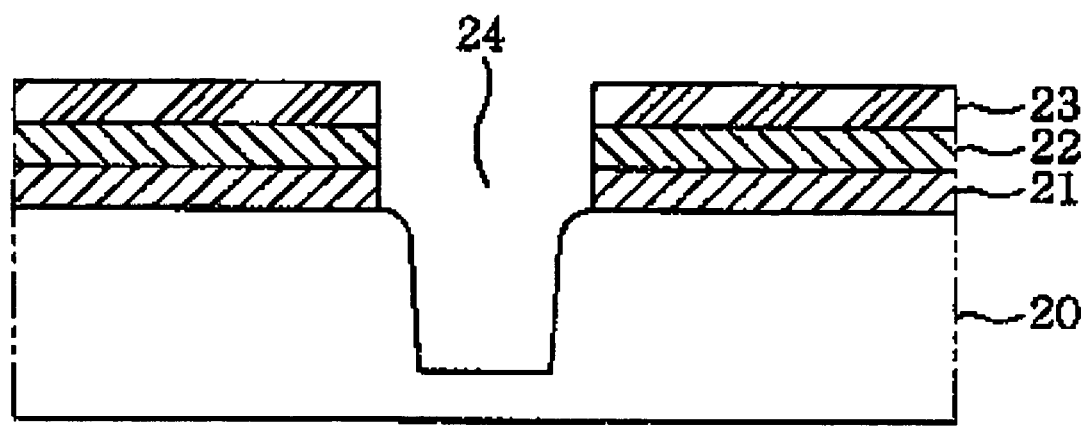

Next, referring to FIG. 5, the TEOS layer 23 can be selectively etched similarly to the silicon nitride layer 22. In this case, wet-etching using dilute HF (DHF) can be used for etching the TEOS.

Figure 6:
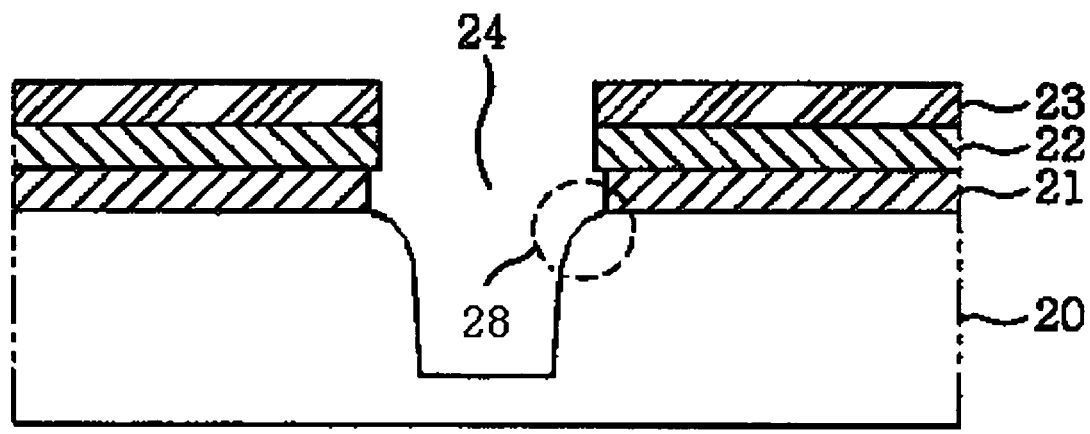

Next, referring to FIG. 6, dry-etching can be performed on the corner of the trench 24 that is exposed by the above process. By doing so, a second rounded shape 28 having a gentler and more gradual sloping than that of the first-rounded shape 26 can be formed on the corner of the trench 24.

The above-described second-rounded upper structure of the trench can more effectively increase gap filling by widening an angle of the trench 24 even more when the trench 24 is filled with an insulating material.

Therefore, it is possible to prevent voids from being created and remarkably improve filling performance during a process of filling an inside of the trench 24 even without forming a separate spacer.

Figure 7:
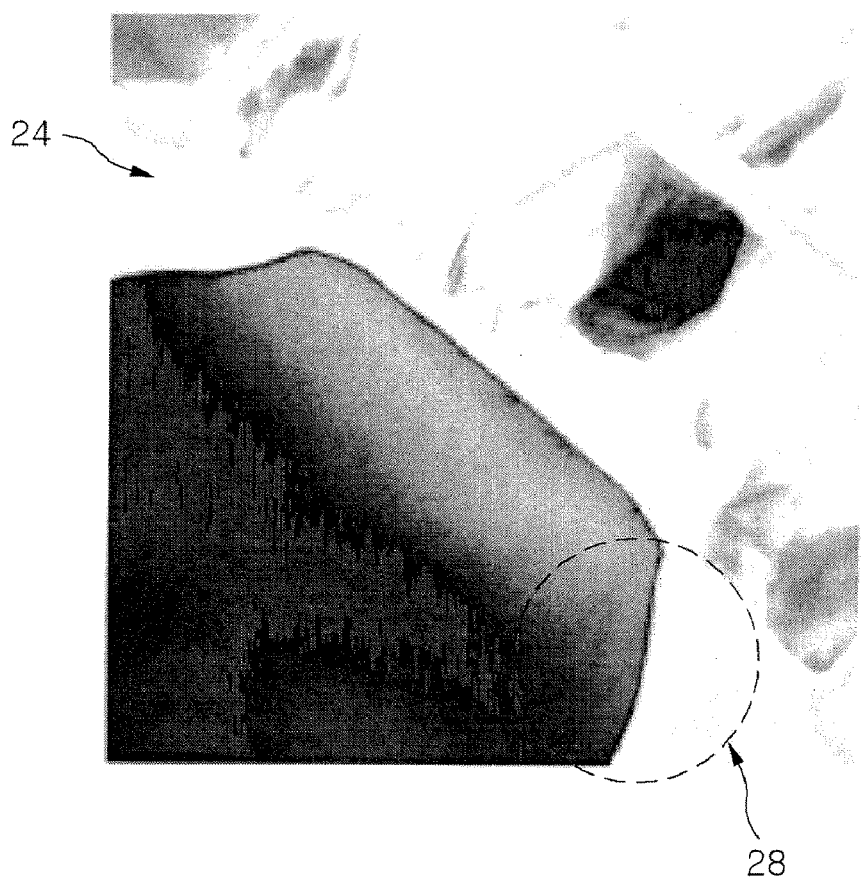

FIG. 7 is a transmission electron microscopy (TEM) photo of a second rounded trench upper structure in a semiconductor device manufactured according to an embodiment of the present invention. Referring to FIG. 7, a corner 28 of a trench 24 has a second-rounded shape 28 having a gentler slope at points over an extended region than a slope of a first-rounded shape.

Figure 8:
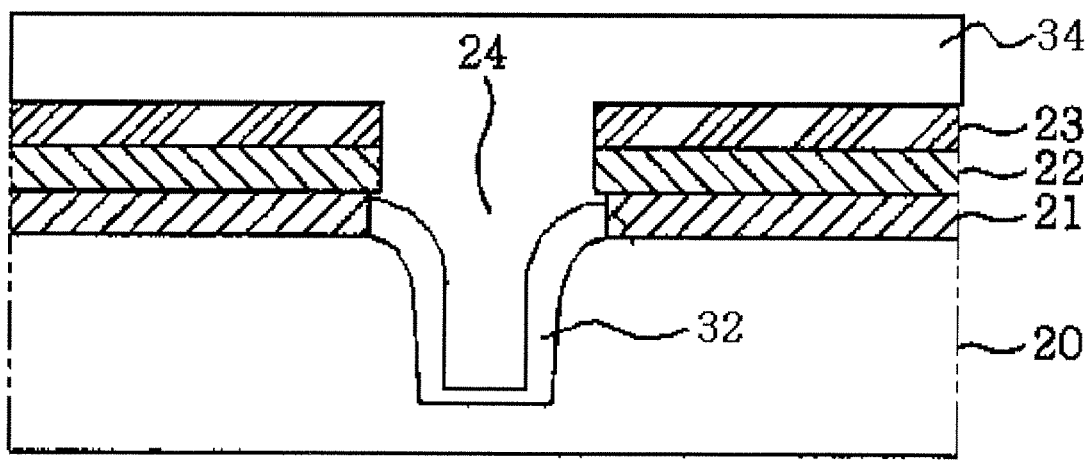

Next, referring to FIG. 8, a liner 32 can be formed to prevent diffusion of oxygen, and an oxide layer 34 for device isolation can be formed. At this point, the second-rounded shape 28 allows the liner 32 of the trench 24 to be rounded. Also, the second-rounded shape 28 allows the oxide layer 34 to be uniformly formed at the vicinity of the upper corner of the trench 24 during a process of burying the oxide layer 34 inside of the trench 24. In other words, a slope of the trench's sidewalls becomes gentle, so that the oxide layer 34 can be prevented from flowing down along the sidewalls, and a portion of the oxide layer 34 that is located on an upper portion of the STI (the trench)'s sidewalls can be prevented from becoming thin during the process of forming the oxide layer 34. Accordingly, the oxide layer 34 can be formed to a uniform thickness on the STI's sidewalls.

As a result, it is possible to prevent a leakage current from being generated from the STI's corner, prevent a reduction of the breakdown voltage, and improve a dimple phenomenon that is generated after chemical mechanical polishing (CMP) for the STI even when a semiconductor device is manufactured according to a minimum design rule.

Also, a device isolation structure can be completed by removing a portion of the oxide layer 34 using an etch-back process or CMP to form a STI structure. Since rounded STI corner reduces an angle of the STI sidewalls, it is possible to prevent voids or gaps from being formed while the STI is filled with an insulation material.

A method for manufacturing a semiconductor device including an STI according to another embodiment of the present invention includes sequentially forming a pad oxide layer and a nitride layer on a substrate, and forming a trench in the substrate.

Figure 9:
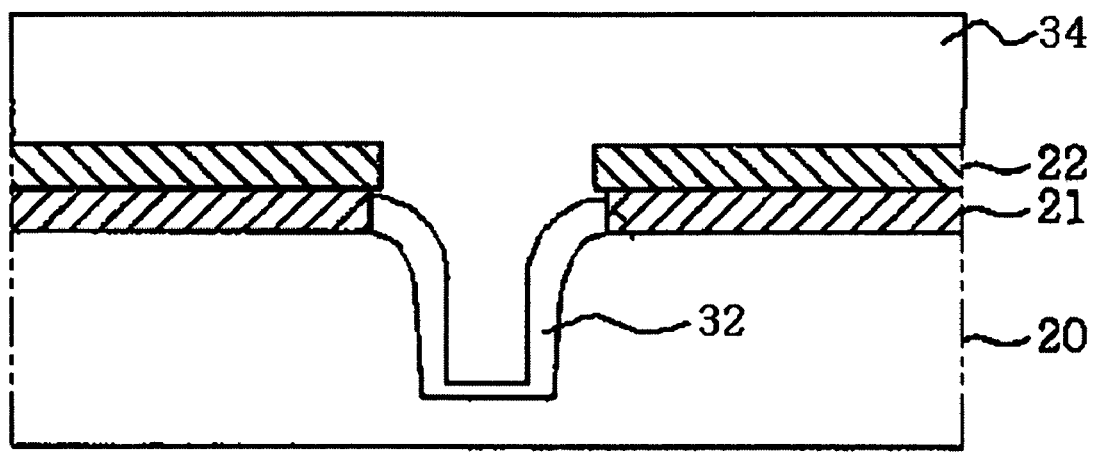
FIG. 9 is a cross-sectional view of a semiconductor device including an STI according to another embodiment of the present invention.

FIG. 9 is a cross-sectional view of a semiconductor device including an STI according to another embodiment of the present invention. The process for manufacturing the semiconductor device shown in FIG. 9 can be performed similar to the process shown in FIGS. 1-8.

In particular, the STI structure shown in FIG. 9 can be formed by sequentially forming a pad oxide layer 21 and a nitride layer 22 on a substrate 20; forming photosensitive layer patterns for limiting a device isolation region on the nitride layer; sequentially dry-etching the nitride layer 22 and the pad oxide layer 21 using the photosensitive layer patterns as a mask; removing the photosensitive layer patterns and dry-etching the substrate 20 using the etched nitride layer 22 and pad oxide layer 21 for a mask to form a trench; pullback-etching a portion of the pad oxide 21 layer by performing post cleaning on an inside of the trench; pullback-etching a portion of the etched nitride layer using wet etching; and dry-etching a portion of an upper corner of the trench of the substrate using the pullback-etched nitride layer and pad oxide layer as masks.

In such an embodiment, the first-rounding can be accomplished during performing post cleaning on the inside of the trench and the second-rounding can be accomplished during dry-etching the portion of the upper corner of the trench. Accordingly, the second-rounded shape 28 allows a trench liner 32 to be rounded. Also, the second-rounded shape 28 allows an oxide layer 34 to be uniformly formed at the vicinity of an upper corner of a trench during a process of burying the oxide layer 34 in an inside of the trench.

As described above, according to a semiconductor device including an STI and a method for manufacturing the same, a corner of a trench is rounded to have a gentle slope in two steps, so that a leakage current caused by a corner of the trench can be prevented from being generated.

Also, according to the present invention, stress can be prevented from being concentrated on the corner of the trench, so that defect generation by the stress at a portion of silicon that neighbors the trench can be prevented.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing a semiconductor device including an STI, the method comprising:
   sequentially forming a pad oxide layer, a nitride layer, and a TEOS (tetra ethyl ortho silicate) layer on a substrate;
   forming photosensitive layer patterns on the TEOS layer for forming a device isolation region;
   sequentially dry-etching the TEOS layer, the nitride layer, and the pad oxide layer using the photosensitive layer patterns as a mask;
   removing the photosensitive layer patterns;
   dry-etching the substrate using the etched TEOS layer, the etched nitride layer, and the etched pad oxide layer as a mask to form a trench after removing the photosensitive layer pattern;
   pullback-etching a portion of the pad oxide layer by performing a post cleaning on an inside of the trench;
   pullback-etching a portion of the etched nitride layer by a first wet etching;
   pullback-etching a portion of the etched TEOS layer by a second wet etching, wherein the post cleaning on the inside of the trench, the first wet etching, and the second wet etching are performed in separate step; and
   dry-etching a portion of an upper corner of the trench of the substrate using the pullback-etched TEOS layer, the pullback-etched nitride layer, and the pullback-etched pad oxide layer as a mask.

2. The method according to claim 1, wherein performing a post cleaning forms a first rounded portion at the upper corner of the trench.

3. The method according to claim 2, wherein dry etching a portion of an upper corner of the trench of the substrate forms a second rounded portion that has a gentler slope at points over an extended region than that of the first rounded portion.

4. The method according to claim 1, wherein pullback-etching a portion of the pad oxide layer by performing a post cleaning laterally etches the pad oxide layer 80-120 Å.

5. The method according to claim 1, wherein pullback-etching a portion of the etched nitride layer comprises immersing the substrate in a phosphoric acid for 1-2 minutes at a temperature of 150-170° C. to remove a predetermined thickness of a lateral side and an upper surface of the nitride layer.

6. The method according to claim 5, wherein the predetermined thickness removed from the lateral side of the nitride layer is 80-120 Å.

7. The method according to claim 1, wherein pullback-etching a portion of the etched nitride layer comprises immersing the substrate in chemicals including $O_3$.

8. The method according to claim 1, wherein pullback-etching a portion of the etched TEOS layer comprises wet-etching using a hydrofluoric acid.

* * * * *